United States Patent [19]

Heuer

[11] 4,156,198
[45] May 22, 1979

[54] KEYBOARD CHANNEL SELECTION FOR TELEVISION RECEIVERS

[75] Inventor: Daniel A. Heuer, Fort Wayne, Ind.

[73] Assignee: The Magnavox Company, Fort Wayne, Ind.

[21] Appl. No.: 754,714

[22] Filed: Dec. 27, 1976

[51] Int. Cl.² ............................................. H04B 1/06
[52] U.S. Cl. .................................. 325/455; 325/464; 325/470
[58] Field of Search ............... 325/453, 455, 457, 464, 325/465, 468, 470; 358/191-193

[56] References Cited

U.S. PATENT DOCUMENTS

| 3,931,579 | 1/1976 | Ma et al. ............................. 325/464 |
| 3,943,451 | 3/1976 | Stoddard ............................ 325/464 |
| 3,988,681 | 10/1976 | Schurmann ....................... 325/470 |
| 4,002,985 | 1/1977 | Merell ................................ 325/455 |
| 4,004,232 | 1/1977 | Amaya ............................... 325/464 |
| 4,077,009 | 2/1978 | Klank et al. ....................... 325/464 |

Primary Examiner—Robert L. Griffin
Assistant Examiner—Jin F. Ng
Attorney, Agent, or Firm—Thomas A. Briody; William J. Streeter

[57] ABSTRACT

Apparatus is provided for tuning a varactor tuning system by means of a keyboard or other switch means. By selecting switches representing the digits of a channel member, a signal is provided for tuning a given channel with a varactor tuner. When a station having a channel number corresponding to the selected channel number is tuned, the tuning of the varactor tuner is inhibited.

4 Claims, 3 Drawing Figures

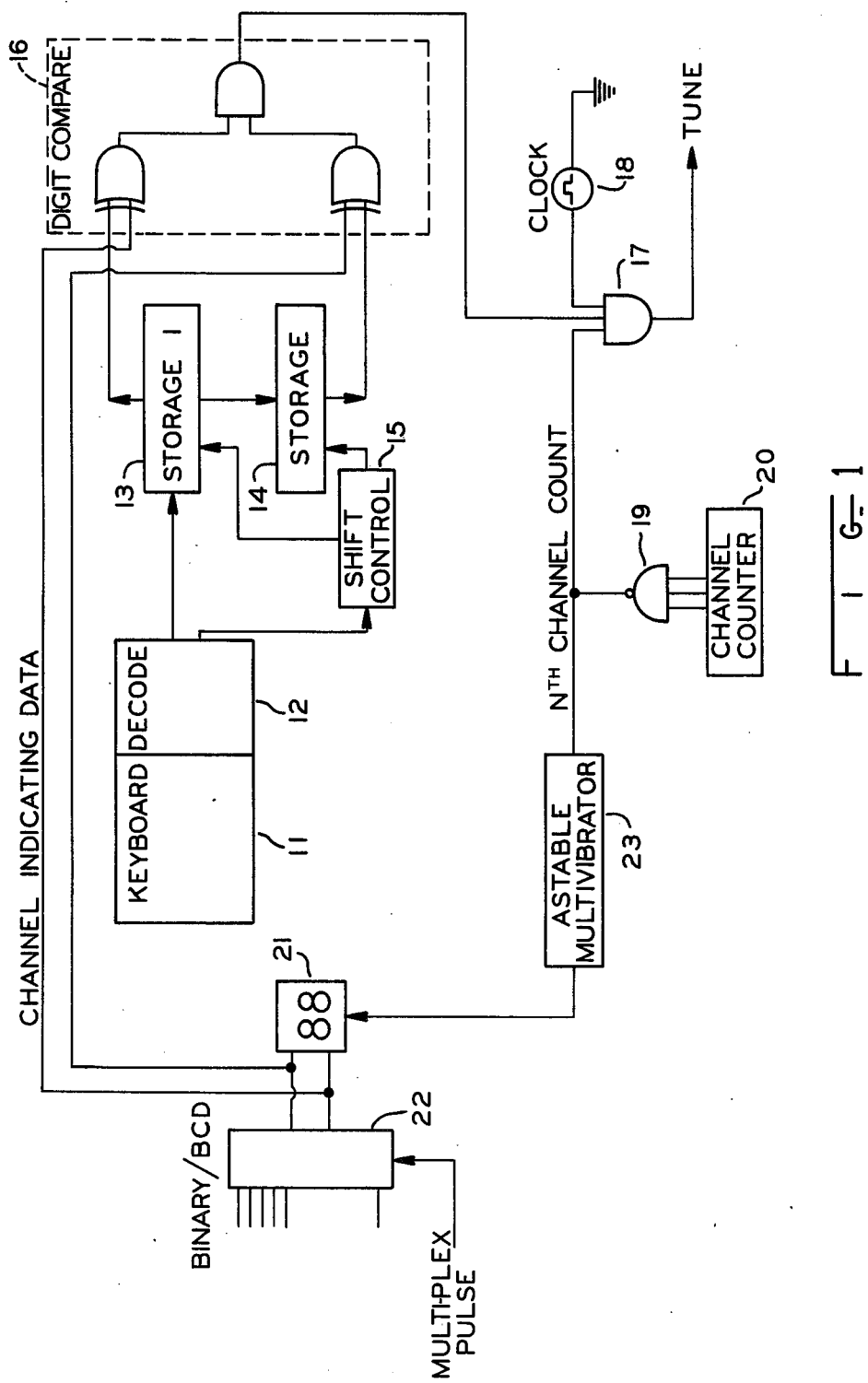

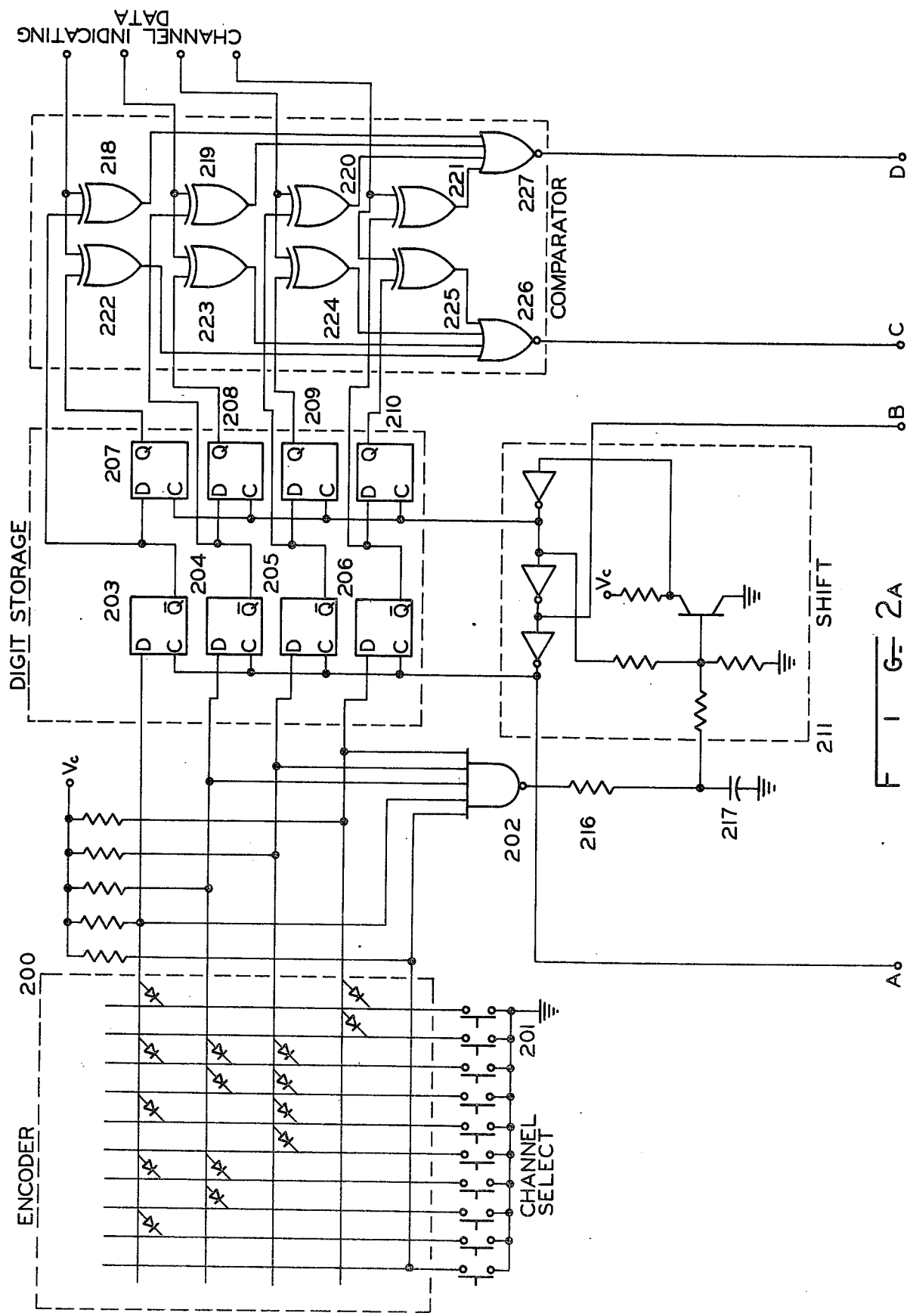

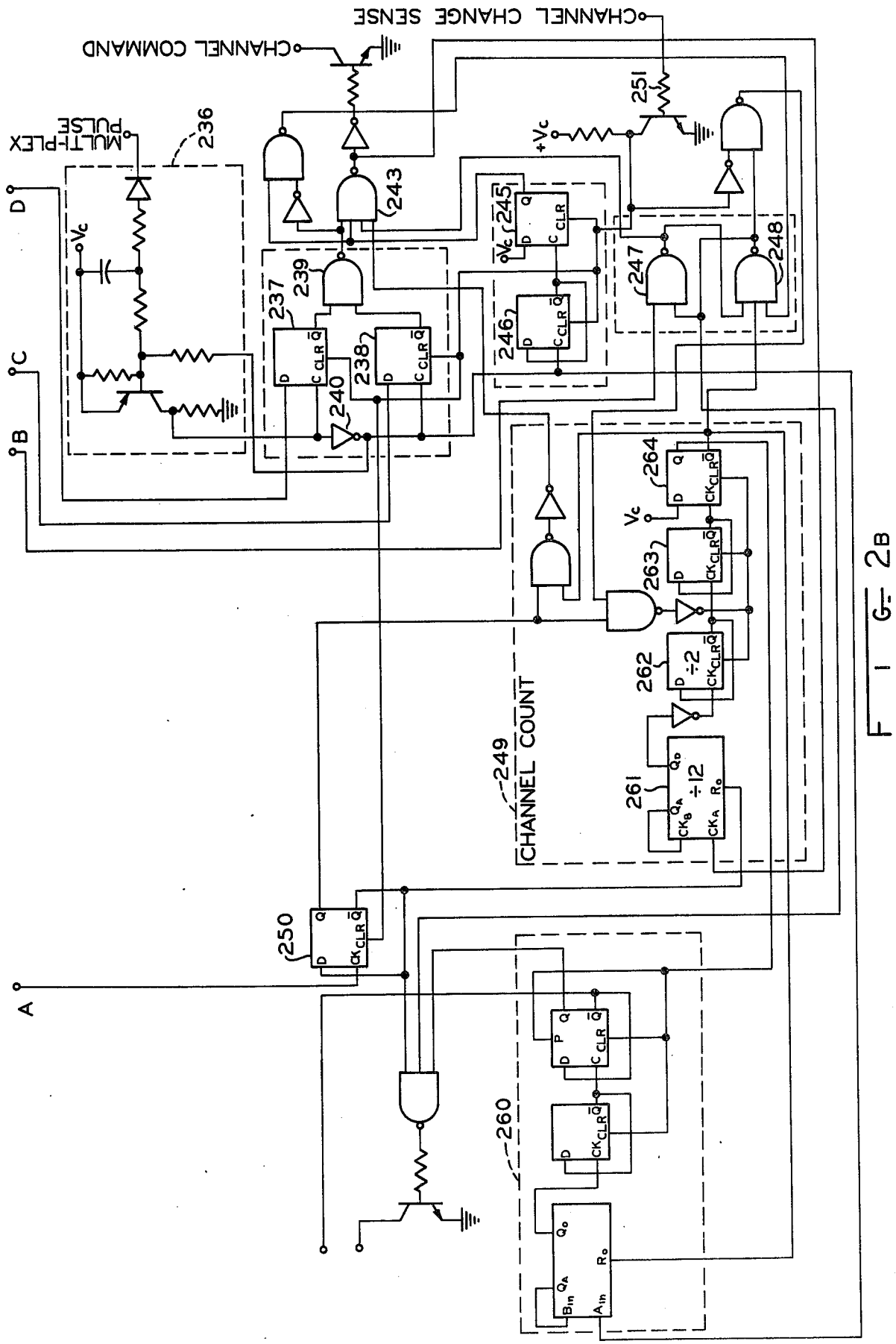

KEYBOARD CHANNEL SELECTION FOR TELEVISION RECEIVERS

BACKGROUND OF THE INVENTION

This invention relates to varactor tuning systems of the type described in a copending application entitled "Digital Tuning System With Programmable Memory", Ser. No. 684,339, by Daniel Heuer and Arthur N. Borg, filed May 7, 1976, now abandoned, hereby incorporated by reference. Specifically, an apparatus for selecting a desired television channel from a keyboard is described.

Varactor tuners are known in the art and numerous tuning systems have been developed for supplying a control voltage for tuning a desired station. Some of these systems are sequentially tuned whereby a depressed switch causes the tuner to tune through the tuning band. When the desired station is reached, the operator releases the switch.

It is, however, desirable to allow an operator to directly select a station by selecting two digits on a keyboard. In tuning systems which utilize a channel memory containing tuning information for the varactor tuner, a keyboard has been used to directly address a memory producing a desired channel tuning. This direct access to the memory containing tuning information by the keyboard is inflexible in that each channel must be preassigned a memory address. The memory in tuning systems of this type is dedicated, i.e., each memory cell will be required to be assigned specific channel tuning information. The operator when selecting a channel number selects a memory address rather than directly selecting a channel number to be tuned.

The present invention does not require direct address to a tuning memory but rather depends upon the detection of a difference between a channel selected and an indication of a presently tuned channel for initiating tuning.

SUMMARY OF THE INVENTION

It is an object of this invention to provide keyboard means to select a desired channel in a varactor tuning system.

It is a further object of this invention to indicate when a selected channel cannot be located in the tuning range of the varactor tuner.

In accordance with the invention, an apparatus is provided for allowing a desired channel to be tuned in a varactor tuning system by depressing sequentially switches representing the digits of the desired channel to be tuned. The closure of the respective switches are sensed, and a coded signal identifying each digit associated with each switch is produced.

Channel data indicating the channel number of a presently tuned station is compared with the coded signal representing the selected channel number. When these two quantities are different, the varactor tuner is caused to scan through its entire frequency spectrum. When the varactor tuner tunes the selected channel, the channel number representing the desired channel to be tuned is equivalent to the channel number of the channel presently tuned and scanning of the varactor tuning system is inhibited. The varactor tuning system remains tuned at the selected channel number.

A more complete understanding of the present invention may be had by reference to the figures and the preferred embodiment.

DESCRIPTION OF THE FIGURES

FIG. 1 is an overall block diagram of the invention used in conjunction with a varactor tuning system having a source of channel indicating data.

FIGS. 2A and 2B are detailed schematic drawing of apparatus for accomplishing the block diagram of FIG. 1.

DESCRIPTION OF THE PREFERRED EMBODIMENT

Referring now to FIG. 1, an embodiment of the present invention is shown for use with a varactor tuning system having a channel display 21 for indicating a presently tuned channel number.

A keyboard 11 consisting of a plurality of numbered switches is used to generate a number representing each digit of a channel number. A standard diode decoder 12 known to those skilled in the art converts the contact closure of a given switch to a binary number, each digit of the binary number being represented by a voltage level.

When a first switch is selected on the keyboard, a first binary number is generated and stored in a storage means 13. The storage means 13 retains the stored digit until a second switch is selected. The selection of a second switch is detected by a shift control means 15. The shift control means 15 causes the contents of the first storage means 13 to be dumped into a second storage means 14. When the contents of the first storage means 13 have been transferred to the second storage means 14, a binary number representing the second selected switch is entered in the first storage means.

The two storage means 13, 14 contain a binary representation of a channel number. A channel command for changing the channel tuning of a varactor tuner is derived by comparing the contents of the two storage means with the currently tuned channel number. When the currently tuned channel number is different from the channel number in the storage means, the tuning command is produced.

In order to make the aforementioned comparison, a two digit comparator 16 receives a reference input from a channel number display 21 located on some television receivers. The channel number display 21 has two binary digits indicating the presently tuned channel for an input. Those skilled in the art will recognize that other means for deriving a signal indicating the channel number of a presently tuned channel may be implemented in other tuning systems thereby permitting the use of this embodiment of the invention.

Before causing the tuning system to tune, an additional condition is imposed before tuning commences. A coincidence detector 17 produces a pulse which advances the tuning of the varactor tuner when comparator 16, clock 18, and a channel counter 20 produces an output. The channel counter 20 is used to determine if all channels have been scanned twice in search of the selected channel number. If the selected channel number is not found to be displayed on display 21 after two consecutive scans of the entire tuning range, gate 19 produces an inhibiting voltage which inhibits the output of coincidence detector 17. Simultaneously, the display 21 is caused to be blanked on and off by astable multivibrator 23 indicating that the desired channel number was not found to be within the tuning capability of the tuning system.

The output signal of the coincident detector 17 comprises a series of pulses. Those skilled in the art will recognize that these pulses may be used to tune the varactor tuning system of the aforementioned copending application without further modification.

Specific circuit details for the apparatus shown in FIG. 1 are given FIGS. 2A and 2B for enabling those skilled in the art to readily practice an embodiment of the invention.

Referring now to FIGS. 2A and 2B, a detailed schematic drawing is shown of circuitry for accomplishing the apparatus of FIG. 1. A keyboard 201 having a plurality of switches each representing a decimal digit, is connected to an encoder 200 comprising a diode matrix. When a single key is depressed, a parallel binary coded word is produced by the encoder 200, and is presented to the input of four type "D" flip flops 203–206, and a shift pulse is produced by NAND gate 202. D flip flops are known in the semiconductor art and are manufactured as standard components. The D flip flops may be operated as either a latch flip flop or a counter. A latch flip flop stores a given input present when a clock pulse transition is detected. The shift pulse is delayed by a resistor 216 and capacitor 217. The shift pulse having been delayed is applied by the circuitry shown in section 211 to the clock input of D flip flops 203–206. The clock pulse, once received, transfers the contents at the input terminals of D flip flops 203–206 to the output terminals of flip flops 203–206.

When a subsequent key is depressed, a second binary coded number is presented to the input of D flip flops 203–206. When each number is selected, NAND gate 202 produces a shift pulse which causes the data presented to D flip flops 203–206 to be transferred to the output of D flip flops 203–206. The first digit selected, represented by the binary number at the output of D flip flops 203–206, is transferred by the subsequent key selection to a second set of D flip flops 207–210. Therefore, at the completion of the selection of two keys representing two decimal degits on keyboard 201, two binary numbers are contained in two sets of D flip flops. These two binary numbers are stored for comparing with the channel number of the presently tuned station in a varactor tuner.

This embodiment contemplates the use of a receiver which has a decimal digit read out for indicating channel numbers. The binary coded decimal information representing the channel number of the presently tuned station is presented to one input of two sets of exclusive OR gates. The first set of exclusive OR gates, 218–221, receives the output from D flip flops 203–206 representing the first digit of the selected channel. Exclusive OR gates 222–225 receive the output from D flip flops 207–210 representing the second digit of the selected channel number. The outputs of the exclusive OR gates 218–221, and 222–225, are supplied to two OR gates, 226 and 227. The first OR gate 226 supplies an output when the first decimal digit selected by the keyboard 201 is equivalent to the first digit of the channel currently tuned. The second OR gate 227 provides an output when the second digit selected is equivalent to the second digit of the presently tuned channel number.

The display used for indicating the presently tuned channel of a television receiver in the aforementioned copending application is a multiplex digit display whereby information representing the first digit is time multiplexed with information representing the second digit. Therefore, only one set of data lines is required. Information representing the first digit and information representing the second digit are received in sequence on the data lines. Therefore, OR gates 226 and 227 will provide an output in time sequence when the channel selected by keyboard 201 is equivalent to the channel indicated by the display.

Referring now to FIG. 2B, the time sequenced outputs from OR gates 226 and 227 are applied to the input of two additional D flip flops 237 and 238. When coincidence between the channel selected and channel tuned is obtained, a multiplex pulse provided by the aforementioned display is used to transfer the output signal from OR gates 226 and 227 to the output of D flip flops 237 and 238. The drive circuitry shown in broken line 236 converts the multiplex pulse to a level for driving the clock inputs of D flip flops 237 and 238. This circuit 236 also delays the multiplex pulse thereby allowing time for the comparator outputs to present data to the inputs of D flip flops 237 and 238. Inverter 240 is used so that D flip flops 237 and 238 are alternately clocked. Alternate clocking of D flip flops 237 and 238 alternately transfers the input voltages of the D flip flop to the output terminals. A NAND gate 239 detects the presence of the data appearing at the output of D flip flops 237 and 238 indicating the coincidence of a channel number selected and the number of the channel actually tuned. When there is coincidence between these two numbers, NAND gate 239 will supply a pulse for inhibiting NAND gate 243. The output of NAND gate 239 therefore provides an indication that the channel selected is not identical with the number of a presently tuned channel, and the receiver tuning should be changed.

Before channel tuning commences, NAND gate 243 receives other pulses for determining when channel tuning shall commence. Only with the simultaneous occurrence of a tuning command from NAND gate 239 and the satisfying of these other conditions will channel tuning commence.

One of the conditions to be satisfied before channel tuning will commence is the generation of two consecutive multiplex pulses. This insures that both inputs to D flip flops 237, 238 have been clocked to the output terminal of the respective latches. The clock input to D flip flop 238 is connected to the clock input of a flip flop 246 operated as a divide by 2 counter. This flip flop 246 supplies a divide by 2 indication to D flip flop 245. When two consecutive clock pulses appearing at D flip flop 238 have been counted, the output of D flip flop 245 will go high and a channel tune command will be supplied to NAND gate 243.

D flip flop 245 is reset when an indication is received from the television receiver that a channel change has in fact been accomplished. An input to transistor 251, indicating a channel change, is used to clear D flip flop 245. By clearing D flip flop 245 and D flip flops 237, 238, new data may be presented for determining whether channel selection is equivalent to the channel actually tuned.

The pulse for indicating that a channel has been selected different from the previous channel tuned may be derived from the circuitry of the aforementioned copending application. Those skilled in the art will recognize numerous ways of detecting the pulse present in the aforementioned copending application and using it to indicate when channel tuning has changed.

An additional condition to be met before tuning commences is the receipt by gate 243 of an indication that two channel number digits have been selected by the operator. A flip flop 250 provides an output when the shift generator 211 supplies two pulses. When two pulses are initiated, flip flop 250 provides a pulse for resetting a channel counter 249 and for enabling one input of NAND gate 243.

The final condition imposed on the system before channel selection commences is an indication that all channels have not been scanned at least twice. This channel counter 249 is implemented to provide for an inhibiting of channel selection when the channel selected is not found within the tuning capability of the television receiver. The output of the channel counter is applied to a flip flop comprising gates 247 and 248. When a digit is selected at the keyboard 201, the flip flop is set by a pulse provided from line B. The receipt of the pulse setting the flip flop causes an enabling of NAND gate 243 so as to allow channel selection to commence. Once channel selection has commenced and all channels within the tuning range of the tuning system have been scanned at least twice, a pulse from the channel counter 249 will be applied to NAND gate 248 causing the flip flop comprising NAND gates 248 and 247 to be reset. The reset effected will cause the gate 243 to be disabled. No channel selection will commence until a second channel number is selected on the keyboard 201.

The channel counter 249 comprises a divide by 12 counter 261 and a divide by 2 counter 262. After a count of 24 is realized, divide by 2 counter 262 provides an output signal to a flip flop 263. This signal indicates that all channels have been counted.

Flip flop 263 is reset when a second count of 24 is detected. This condition indicates that all channels have been counted twice. Flip flop 263 when reset causes D flip flop 264 to be in a latched condition, thereby inhibiting further tuning of the varactor tuner until another channel selection is made.

When the aforementioned condition of selecting a channel not within the tuning capability of the receiver is detected, an indication may be provided for telling the operator that the desired channel was not found. A counter 260 may be used to divide a clock pulse as shown to provide a low frequency pulse which may be used to pulse the digital display in some television receivers on and off at a slow rate thereby indicating that the channel was not found to be within the tuning capability of the tuning system. Those skilled in the art will recognize other means for indicating that channel selection cannot be achieved.

Thus there has been described with respect to one specific embodiment a system for generating a channel selection command by means of keyboard or other switch actuating means. Those skilled in the art will recognize other embodiments of the invention more specifically described in the claims to follow.

What is claimed is:

1. Channel selection apparatus for selecting a channel tuning frequency of a varactor tuning system comprising:
   (a) keyboard means for selecting the number of a desired channel to be tuned;
   (b) means for producing an enabling signal when a selected channel number is different from the number of a currently tuned channel;
   (c) means for continuously changing the tuning of said varactor tuning system when said enabling signal is produced;
   (d) means for inhibiting channel tuning after a predetermined number of channels have been tuned; and
   (e) channel counter means for determining when all possible channels have been tuned in response to said enabling signal, said channel counter means providing a signal to said means for inhibiting channel tuning whereby channel tuning ceases.

2. The apparatus of claim 1 further comprising means for indicating that channel tuning has been inhibited.

3. In a varactor tuning system having a digit display means for indicating a presently tuned channel number, an entry system for selecting a specific channel comprising:
   (a) keyboard means for selecting the number of a channel to be tuned;
   (b) means for encoding said keyboard selection to provide a first coded signal for indicating a channel number;
   (c) means for producing a second coded signal representing the digits of said digit display means;
   (d) means for comparing said first and second coded signals whereby an actuating signal is provided when a selected channel number is different from the channel number shown on said digit display means;
   (e) means for changing the tuning of said varactor tuning system in response to an actuating signal from said means for comparing whereby continuous tuning of the varactor tuning system will occur until a number displayed on said digit display means is equivalent to said selected channel number;
   (f) means for counting the number of channels which have been tuned in response to said actuating signal;
   (g) means for inhibiting said actuating signal when a predetermined number of channels have been tuned.

4. The apparatus of claim 3 further comprising means alternately blanking said digit display when said predetermined number of channels has been tuned.

* * * * *